United States Patent
White et al.

[11] Patent Number: 5,897,380
[45] Date of Patent: Apr. 27, 1999

[54] METHOD FOR ISOLATING A SUSCEPTOR HEATING ELEMENT FROM A CHEMICAL VAPOR DEPOSITION ENVIRONMENT

[75] Inventors: Carl White, Gilbert; Jon R. MacErnie, Chandler; Joseph T. Hillman, Scottsdale, all of Ariz.

[73] Assignee: Tokyo Electron Limited, Tokyo, Japan

[21] Appl. No.: 08/615,454

[22] Filed: Mar. 14, 1996

Related U.S. Application Data

[62] Division of application No. 08/336,496, Nov. 9, 1994, Pat. No. 5,562,947.

[51] Int. Cl.$^6$ ........................... H01L 21/31; H01L 21/469
[52] U.S. Cl. ............................................................. 438/780
[58] Field of Search ..................... 438/780, 781, 438/782, 783; 165/80.1

[56] References Cited

U.S. PATENT DOCUMENTS

| | | |
|---|---|---|
| 3,407,783 | 10/1968 | Capita . |
| 5,148,714 | 9/1992 | McDiarmid . |
| 5,252,131 | 10/1993 | Kiyama ................................. 118/725 |
| 5,267,607 | 12/1993 | Wada . |
| 5,273,588 | 12/1993 | Foster et al. ........................ 118/723 E |
| 5,370,739 | 12/1994 | Foster ...................................... 118/725 |
| 5,478,609 | 12/1995 | Okamura ................................ 118/725 |
| 5,595,241 | 1/1997 | Jelinek .................................. 165/80.1 |

FOREIGN PATENT DOCUMENTS

| | | |
|---|---|---|
| 3633386 | 4/1988 | Germany . |
| 4092221 | 1/1992 | Germany . |
| 60-136314 | 7/1985 | Japan ..................................... 118/728 |

*Primary Examiner*—Charles Bowers
*Assistant Examiner*—Craig Thompson
*Attorney, Agent, or Firm*—Wood, Heron & Evans, LLP

[57] ABSTRACT

An apparatus for efficiently heating a wafer within a CVD environment isolates the heating element of the apparatus from the CVD environment and includes a susceptor body defining a sealed space therein for containing the heating element and a surface coupled to the heating element for supporting and heating the wafer. The susceptor space is sealed from the CVD environment and is vacuumed to a first pressure. Heating gas is delivered through a space extending through the susceptor body which is sealed from the susceptor space containing the heating element and is vacuumed to a second pressure which is preferably less than the CVD reaction pressure to vacuum clamp a wafer to the susceptor. The heating gas delivery space is formed by an elongated sheath surrounding a hollow wafer lift tube and the sheath is sealed at one end to the backplane of the susceptor and at the other end to the tube. The wafer lift tube moves up and down within the sheath to lift a wafer. Various unique seals provide isolation of the heating element space and gas delivery space from each other and from the CVD reaction environment to protect the heating element from the corrosive effects of CVD vapors.

17 Claims, 5 Drawing Sheets

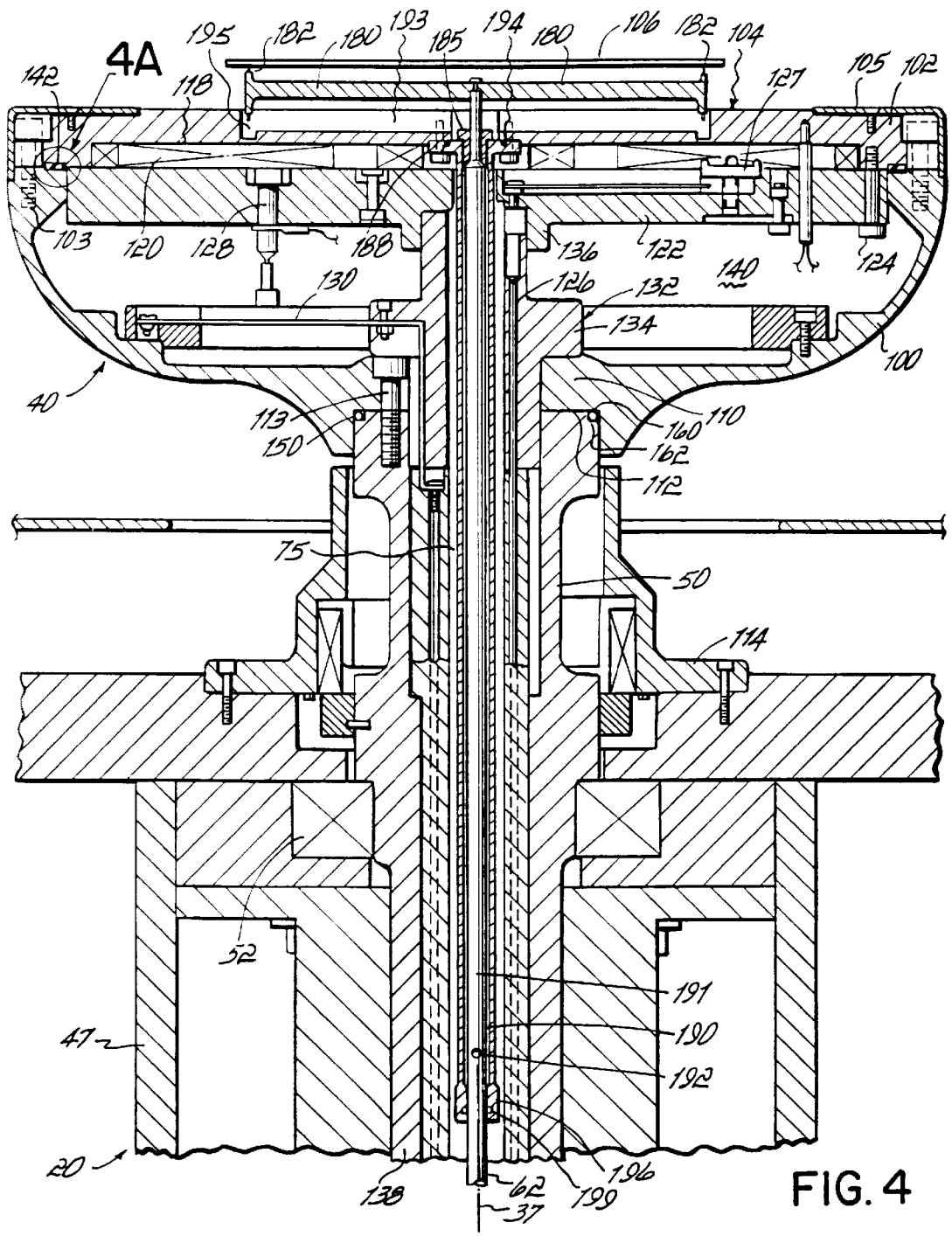
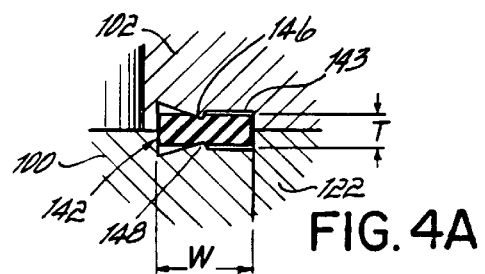
FIG. 4
FIG. 4A

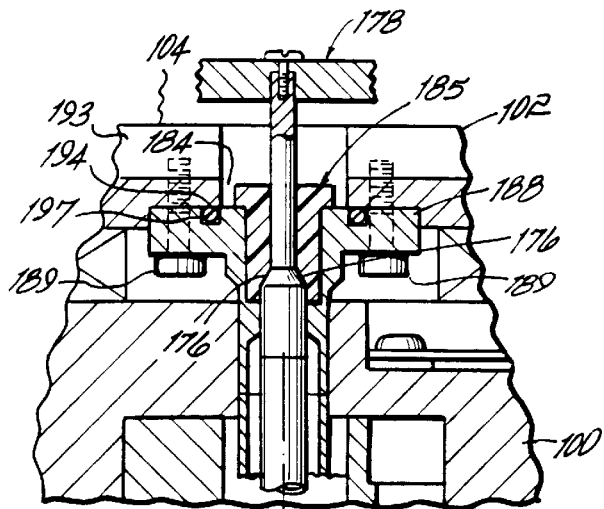
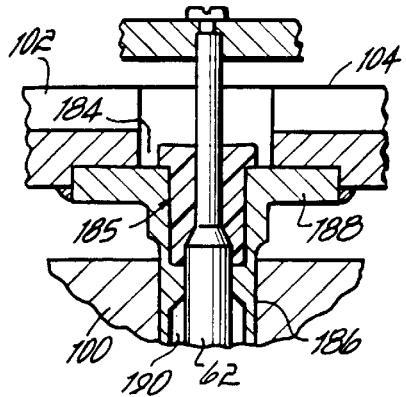
FIG. 5A
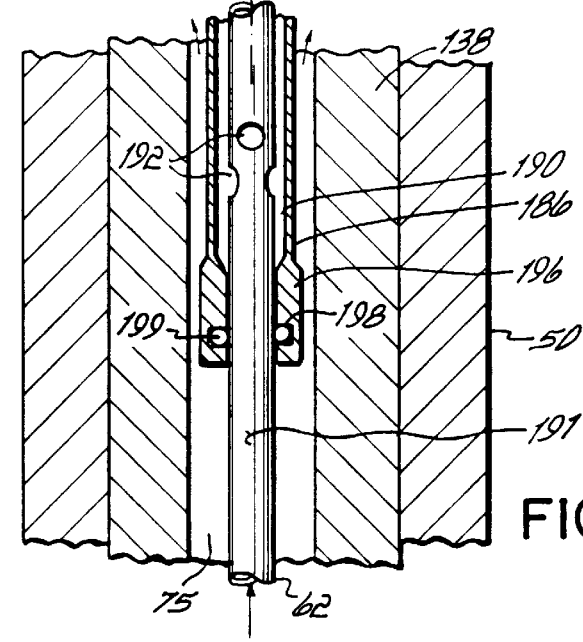
FIG. 5
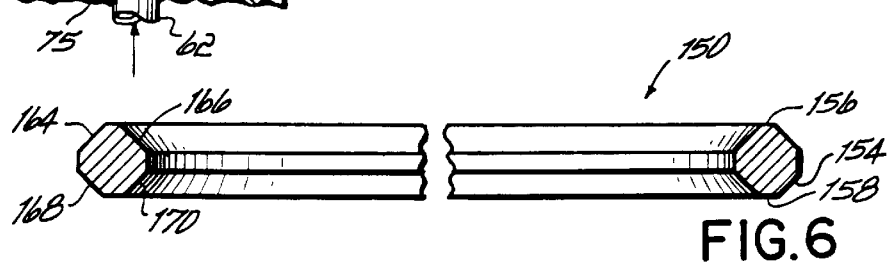
FIG. 6
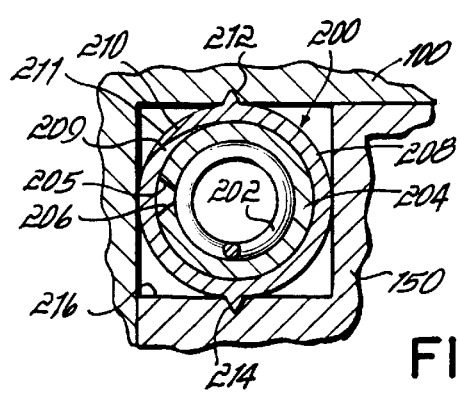
FIG. 7

METHOD FOR ISOLATING A SUSCEPTOR HEATING ELEMENT FROM A CHEMICAL VAPOR DEPOSITION ENVIRONMENT

RELATED APPLICATIONS

This is a divisional application of application Ser. No. 08/336,496, filed on Nov. 9, 1994, now U.S. Pat. No. 5,562,947 entitled METHOD AND APPARATUS FOR ISOLATING A SUSCEPTOR HEATING ELEMENT FROM A CHEMICAL VAPOR DEPOSITION ENVIRONMENT.

FIELD OF THE INVENTION

This application relates generally to a heated semiconductor wafer processing susceptor which utilizes backside gas to facilitate heat transfer to the wafer in a chemical vapor deposition ("CVD") reaction chamber, and more particularly to an apparatus and method for isolating and protecting the susceptor heater element from the CVD environment.

BACKGROUND OF THE INVENTION

Semiconductor wafers are subject to a variety of processing steps in the course of the manufacture of semiconductor devices. The processing steps are usually carried out in a sealed vacuum chamber of a wafer processing system. One such group of processing steps is referred to collectively as chemical vapor deposition or CVD. CVD encompasses deposition of material layers onto a wafer by a reaction of various chemicals which are usually in a gaseous or vapor state. However, CVD processes might also involve chemical etching of the wafer. Various of the chemical gases and vapors used in CVD process are corrosive to some of the metal parts and devices utilized in the reaction chamber of a wafer processing system. Accordingly, it is necessary to isolate and protect such parts and devices from the chemical gases.

CVD processes generally involve heating the wafer prior to deposition or etching. CVD is typically performed in a cold wall reactor, where the wafers to be coated or etched are heated to a reaction temperature on a wafer-supporting susceptor while other surfaces of the reactor are maintained at sub-reaction temperatures to prevent the deposition of films thereon. For tungsten chemical vapor deposition, for example, the wafer is heated while the reactor walls are cooled, often to around ambient room temperature. Alternatively, for titanium nitride chemical vapor deposition, the walls may be heated above ambient room temperature, but to a temperature below that of the wafer being coated.

Heating substrates in a chemical vapor deposition environment within a reactor is often difficult because the heating elements used to heat the wafer must be isolated from the corrosive chemical vapors and gases utilized in the CVD process. One possible solution involves the use of infrared (IR) radiation to heat the wafer which is directed onto the wafer from outside the reaction chamber through IR windows formed in the reactor. However, temperature uniformity is often difficult to achieve with IR radiation, because the IR windows become coated with material layers by the CVD process leading to inconsistent heating of the wafer. Alternatively, resistive or resistance-type heaters coupled to the wafer-supporting susceptor within the reactor have provided better temperature uniformity and stability.

Generally, resistance-type heaters are mounted within a wafer-supporting susceptor structure to a susceptor backplane or platen and operate to heat the susceptor backplane and simultaneously heat the wafer to the desired operating temperature. However, since resistance-type heating elements must heat the susceptor backplane while heating the wafer, the thermal response time may be slower than is desired to achieve maximum throughput of the wafers. Therefore, to improve the thermal response time, a gaseous medium, such as helium, is pumped between the susceptor backplane surface and the wafer supported on the backplane which enhances the transfer of heat between the susceptor backplane and wafer.

A typical semiconductor wafer-supporting susceptor provided within a reaction chamber has fixed to its bottom a susceptor drive support frame. Rotatably mounted within the drive support frame is a hollow susceptor drive shaft which is utilized to rotate the susceptor, when desired, during CVD processing. The hollow susceptor drive shaft is rigidly connected to the bottom of the susceptor. A hollow space within the drive shaft communicates with the interior of the susceptor inside the reaction chamber. Penetrations and openings are made in the susceptor and susceptor backplane so that a vacuum hold of the wafer may be accomplished. Ordinarily, the vacuum pressure inside the hollow drive shaft and within the susceptor interior is maintained at a pressure sufficiently lower than that of the reaction chamber to develop a vacuum within the susceptor which operates as a vacuum chuck to hold a wafer against the heated susceptor backplane during processing. However, the penetrations in the susceptor and a susceptor backplane, as well as the interface between the drive shaft and susceptor, provide paths for corrosive chemicals to enter the interior of the susceptor and come into contact with the heating elements. As a result, the heating elements may be damaged, especially whenever a wafer is not held to the susceptor backplane under vacuum to block the backplane penetrations and openings.

Furthermore, penetrations through the susceptor and backplane must also be made to provide a passage for the heating gas to reach the backside of the wafer. Again, the susceptor heating elements are somewhat isolated from the corrosive chemical vapors as long as the penetrations are covered by a wafer, but when the wafer is not present, there is a direct path for corrosive gases from the reaction chamber to the heating elements through the heating gas penetrations.

Accordingly, there is a need for a susceptor or similar wafer-supporting device for use in a CVD environment which provides adequate isolation and protection of the heating elements from the corrosive chemical vapors both during processing of a wafer and upon removal of the wafer. There is further a need for such a device which isolates the heating elements while providing satisfactory heating of the wafer as well as supplying backside heating gas to the wafer for more efficient heat transfer.

SUMMARY OF THE INVENTION

To address the needs within the prior art, the present invention provides a susceptor/heater assembly which utilizes two separate vacuum environments to effectively isolate resistive heating elements from corrosive chemical vapors utilized in CVD processing.

In accordance with the principles of the present invention, a susceptor located inside a CVD reaction chamber includes a body which has formed therein a heater housing for supporting and containing one or more resistive heating elements. The heating element is fixed to a susceptor backplane mounted to the body which heats and supports a wafer during CVD processing. The heater housing formed within the susceptor body is evacuated to create a first vacuum environment. The first or outer vacuum environment is maintained at a pressure of approximately 1 Torr to 100 Torr, and preferably around 25 Torr. The pressure within the first vacuum environment is also preferably maintained slightly above the process pressure within the reaction chamber. As a result, any leakage between the reaction chamber and the first vacuum environment in the heater housing will be out of the heater housing and into the reaction chamber rather than into the heater housing. The first vacuum environment is sealed from the CVD reaction chamber to prevent leakage in accordance with the objectives of the invention.

More specifically, the first vacuum environment is formed by sealing the heater housing with two high temperature metal seals. The seals prevent the corrosive gases and vapors of the reaction chamber from entering the heater housing and damaging the resistive heating elements and maintain a sealed environment which withstands the high temperatures of CVD processing. The first seal is maintained between the susceptor body and the backplane structure rigidly mounted to the top of the susceptor body. The first seal is preferably a silver compression seal which extends annularly around the susceptor body and backplane interface to prevent leakage of the reaction chamber environment into the heater housing environment at that interface.

A composite metal second seal is utilized between the bottom of the susceptor body and its interface with a drive shaft which rotates the susceptor and provides a vacuum of the heater housing. The second seal has a core with a unique diamond-shaped cross-section which is preferably stainless steel. A ductile metallic coating, preferably silver, surrounds the core and is deformed to accommodate surface imperfections between the susceptor body and drive shaft. The composite metal seal is dimensioned and formed to withstand a large number of thermal cycles without affecting the integrity of the seal.

Backside heating gas is delivered through a hollow wafer lift tube which extends through openings within the susceptor body and backplane and connects to a movable wafer support. The lift tube provides gas, such as helium, between the wafer and backplane for efficient thermal conductivity between the resistive heating elements, the susceptor backplane, and the wafer. The lift tube is vertically movable to lift a wafer on the backplane and break the vacuum clamping hold and extends generally concentrically inside the susceptor drive shaft. A second or inner vacuum environment is maintained around a portion of the lift tube proximate the backplane.

Specifically, the lift tube which carries the backside heating gas extends through the center of the susceptor body and backplane. The lift tube is surrounded along part of its length by a sheath which defines an inner vacuum space. The lift tube is also coupled to a vacuum system which evacuates the inside of the lift tube and the inner vacuum space of the sheath to define the second vacuum environment. The vacuum space of the sheath is coupled to the back of the wafer through an opening in the susceptor backplane. The second vacuum environment through which the backside heating gas travels is maintained at a pressure of approximately 1 Torr to 100 Torr which is dependent upon the processing pressure within the reaction chamber. Preferably, the pressure in the second vacuum environment is maintained at about 10 Torr. The pressure in the second vacuum environment is generally lower than process pressure maintained within the reaction chamber to maintain a vacuum holddown of the wafer onto the susceptor backplane during processing. When no wafer is present, the second vacuum environment and the backside gas delivery system are maintained at the processing pressure of the reaction chamber.

To prevent the entry of corrosive chemical vapors into the heater housing through the second vacuum environment and backside gas delivery system, the second vacuum environment is isolated from the first vacuum environment by several seals. An upper seal is maintained between the inner face of the susceptor backplane and the sheath which surrounds the lift tube. The upper seal is preferably a nickel compression seal which is formed of 100% nickel and is configured to withstand high CVD processing temperatures without compromising the seal. A lower seal is utilized between the sheath and the lift tube. The lower seal of the second vacuum environment is preferably a dynamic seal through which the lift tube may move as it travels vertically to lift the wafer away from the backplane. Alternatively, the upper seal might be eliminated by welding the sheath to the backplane.

Therefore, during CVD processing, three vacuum environments exist within the CVD reaction chamber. The first vacuum environment within the heater housing surrounding the resistive heating elements is isolated from both the reaction chamber environment and the backside gas delivery second vacuum environment extending through the center of the heater housing. The pressure within the first vacuum environment is maintained higher than the process pressure within the reaction chamber to prevent the leakage of corrosive chemical vapors into the heater housing. When a wafer is being processed, the pressure within the second vacuum environment is lower than the reaction chamber pressure to insure a vacuum holddown of the wafer. When there is no wafer present, there is direct communication between the reaction chamber environment and the second or second or backside gas vacuum environment. However, this is not harmful because the second vacuum environment is sealed from the heater housing first vacuum environment, and therefore, no corrosive chemical vapors can pass through the backside gas delivery system into the heater housing and into contact with the resistive heating elements. As a result, the various seals and multiple vacuum environments provide constant isolation of the heater housing environment and resistive heating elements from the chemical vapors present in the reaction chamber environment. Thus, the heating elements are protected while the backside gas is delivered to the backside of the wafer to facilitate a more efficient heat transfer between the heating elements and the wafer.

These and other objectives and advantages of the present invention will become more readily apparent in the following Detailed Description of the Invention taken in conjunction with the drawings herein.

BRIEF DESCRIPTION OF THE DRAWINGS

FIG. 3A is a cross-sectional view taken along line 3A—3A of FIG. 3;

FIG. 4 is a cross-sectional view of a susceptor used in the CVD reactor shown in FIGS. 1 and 2, and incorporating the principles of the present invention;

FIG. 4A is an enlarged cross-sectional view of an encircled portion 4A of FIG. 4 showing a sealing structure;

FIG. 5 is an enlarged cross-sectional view of portions of FIG. 4 showing additional sealing structures of the present invention;

FIG. 5A is an enlarged cross-sectional view of a portion of FIG. 4 showing the sheath welded to the backplane;

FIG. 6 is a cross-sectional view of another one of the sealing structures utilized in the susceptor of FIG. 4;

FIG. 7 is a cross-sectional view of an alternative embodiment for a sealing structure of the invention.

DETAILED DESCRIPTION OF THE INVENTION

Figure 1:
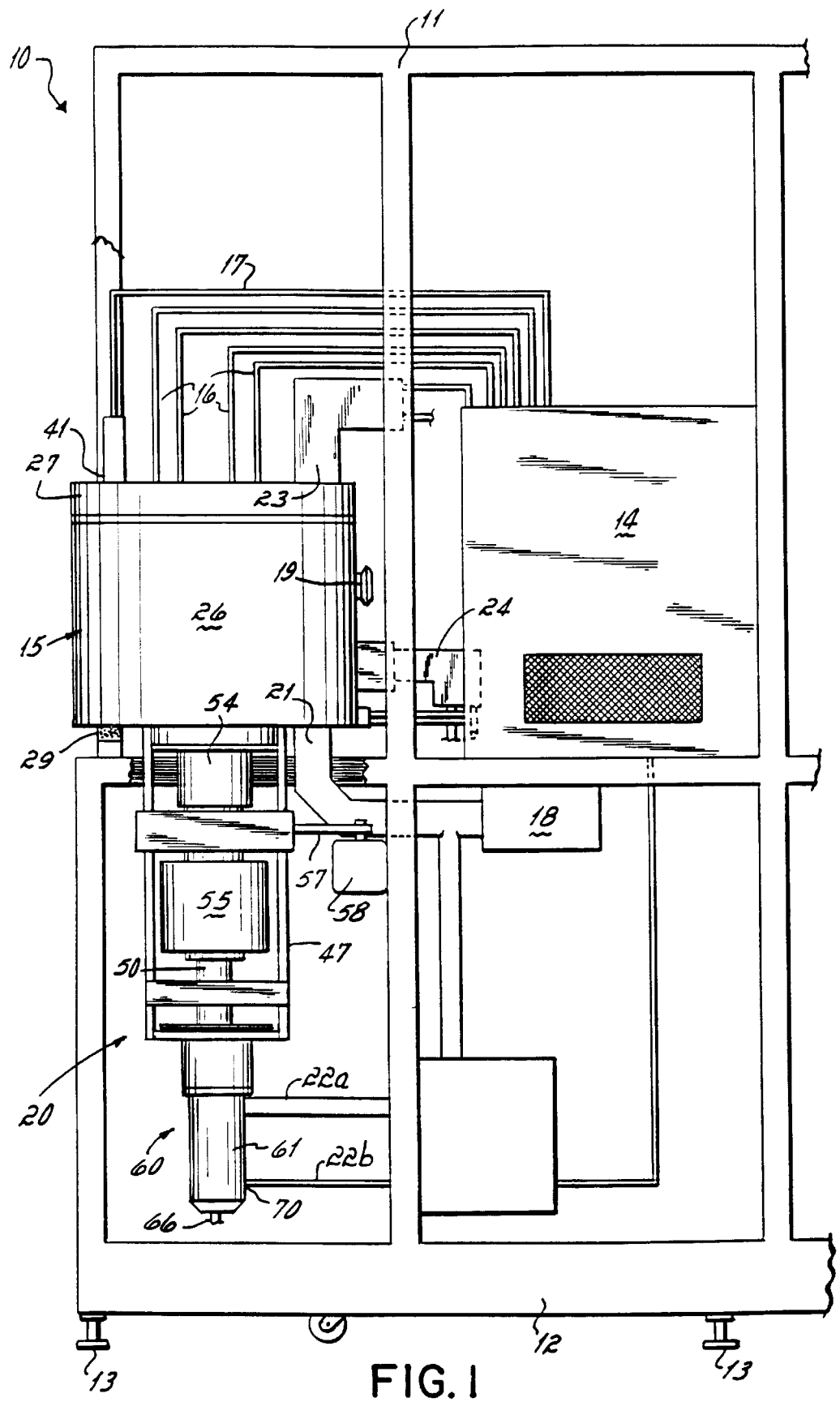
FIG. 1 is an elevational view of a CVD module for a wafer processing device embodying the principles of the present invention.

FIG. 1 illustrates a CVD module 10 for a wafer processing cluster tool. Module 10 is the same as that shown in U.S. Pat. No. 5,273,588 issued on Dec. 28, 1993 and assigned to the assignee of the present invention, the entire disclosure of which is hereby incorporated by reference in its entirety. The module 10 includes a frame 11 on a wheeled base 12, which has depending therefrom a set of adjustable feet 13 for leveling the module 10 and anchoring the module 10 to a floor. The module 10 includes a cabinet 14 fixed to the frame 11 that contains flow controllers with connections for inlet lines for supplying reactant gases to a chemical vapor deposition (CVD) reactor 15, also fixed to the frame 11. The cabinet 14 has associated with it other parts of the reactor support system that are not shown, including fluid conduits, valves, pumps, controls, and associated hardware for the operation of the reactor 15 including the supplies and connections to supplies of the various reactant gases, inert gases, purging and cleaning gases, and cooling fluids for the reactor 15.

The reactant gases for the main CVD process to be performed with the reactor 15 are gases used for a blanket tungsten deposition process onto silicon semiconductor wafers and are supplied through lines 16, shown as four in number, connected between the cabinet 14 and the reactor 15. These gases include, for example, tungsten hexafluoride ($WF_6$), hydrogen ($H_2$), and silane ($SiH_4$). The reactor is, however, also useful for titanium nitride films and for many other films that can be applied through a CVD process. Also supplied through one of the lines 16 may be inert gas such as argon. In addition, reactant gas for the plasma cleaning of the chamber 15, such as nitrogen trifluoride ($NF_3$) gas, is supplied through a gas inlet line 17 connected between the cabinet 14 and the reactor 15. The module 10 also includes one or more vacuum pumps 18, and usually one high volume low vacuum pump and one low volume high vacuum pump, for evacuating the reactor 15, for maintaining a vacuum within the reactor 15 at the required operating pressure levels, and for exhausting unused reactant gas, reaction byproducts, cleaning gases and inert gases flowing through the reactor. A residual gas analyzer port 19 is provided for monitoring the constituents of the gas.

The reactor 15 includes a susceptor rotating and wafer elevating mechanism 20 depending from the bottom of the reactor 15. The main evacuation of the reactor 15 is accomplished through a vacuum outlet line 21 connected between the reactor 15 and the vacuum pump or pump assembly 18 while one or more auxiliary vacuum outlet lines 22a, 22b are provided, connected between the mechanism 20 and the pump assembly 18. A combined upper electrode electrical terminal and cooling fluid manifold connector 23 and a combined lower electrode electrical terminal and cleaning gas connector 24 are also connected between the reactor 15 and the support systems in the vicinity of cabinet 14.

Figure 2:
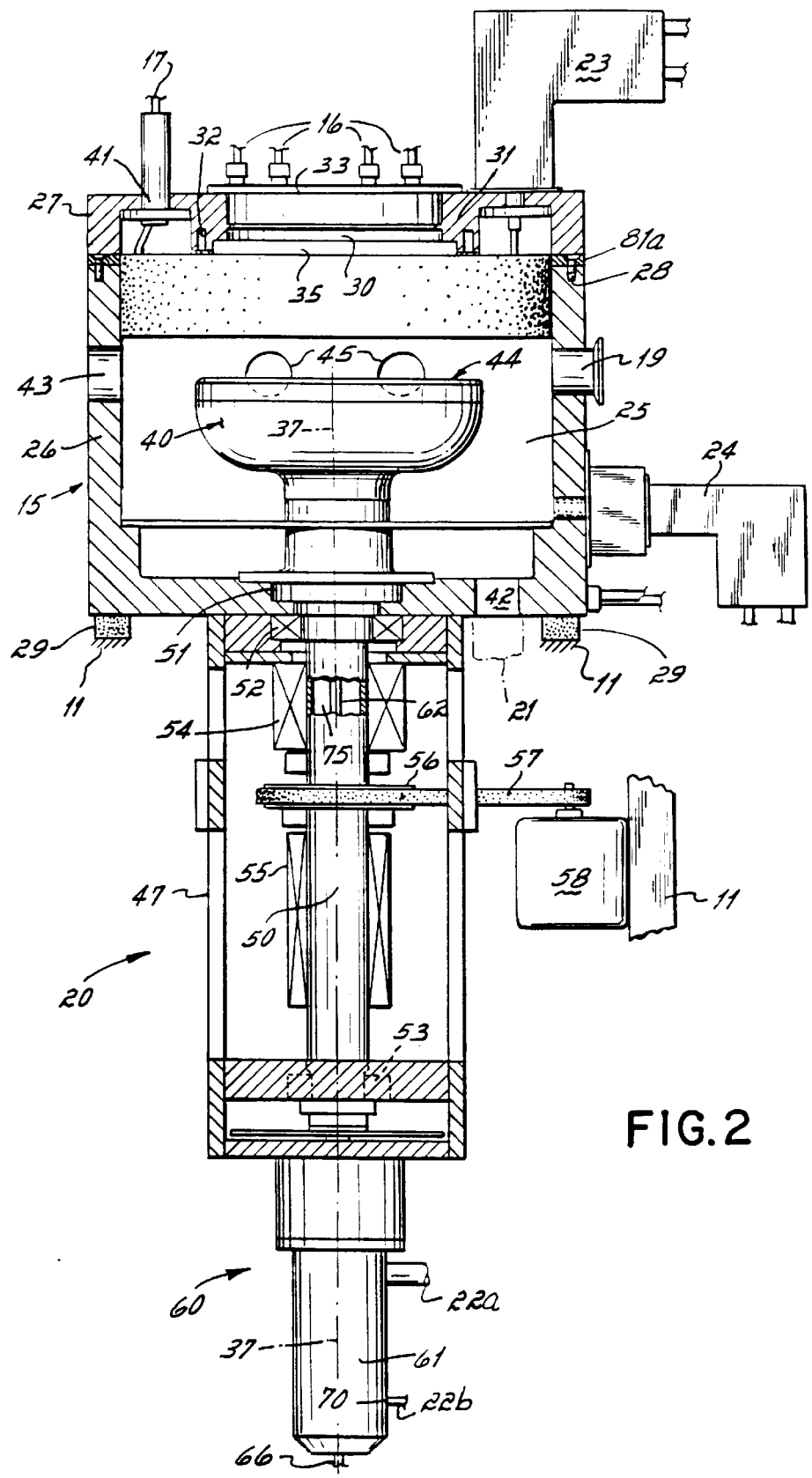
FIG. 2 is a cross-sectional view of a CVD reactor of the module of FIG. 1.

Referring to FIG. 2, the CVD reactor 15 has sealed within it a reaction chamber 25 enclosed in a housing 26 by which the reactor 15 is mounted through rubber vibration absorbing pads 29 to the frame 11 and from the bottom of which the mechanism 20 is supported. The housing 26 is preferably made of aluminum with a highly polished interior, and is provided with independent temperature control, both for heating and cooling of the reactor walls, to produce what is sometimes generically referred to as a cold wall reactor, as distinguished from an oven type reactor in which the susceptor is heated by radiant heat from a heated reactor wall. The housing 26 is preferably fluid cooled, by a suitable fluid such as ethylene glycol or water. In addition, resistance heating elements (not shown) are also provided in the housing 26 so that the housing may be heated, or, alternatively or in addition, rod type heating elements may be provided in the chamber at various locations. One or more of the heating or cooling features may be employed in the same structure, depending on its intended applications. The heating and cooling of the reactor wall may be zoned controlled, and may have both the heating and cooling active simultaneously for more responsive temperature regulation and uniformity.

The housing 26 has, at the top thereof, a chamber cover 27, preferably also of aluminum, enclosing the reaction chamber 25 within. The cover 27 is pneumatically sealed against the top of the housing 26, or spacers 81a if employed, and may be pneumatically held thereto or may be mechanically secured thereto by screws 28 or clamps. The cover 27 has a reactant gas mixing chamber 30 surrounded by an annular mixing chamber wall which may be formed integrally of the aluminum chamber cover 27 or of a separate material such as a machinable ceramic or separate aluminum or other metal piece and secured to the underside of the chamber cover 27. The mixing chamber wall 31 is capable of being actively cooled, where the process, for example a tungsten deposition process, so requires, by cooling fluid supplied to flow through an annular passage 32 formed in the wall 31 to maintain it at a temperature lower than the reaction temperature that is independent of that of the housing 26 and that of the chamber cover 27. Like the housing 26, the mixing chamber wall 31 is also provided with resistance heating elements (not shown) to heat the wall and the mixing chamber 30 where the process so requires, such as for titanium nitride deposition. This annular wall 31 may be made of a thermally conductive material or of a conductive material thermally insulated from the aluminum material of the cover 27 to provide greater flexibility in the control of its temperature. The upper portion of the mixing chamber 30 is closed by a removable cover or top plate 33, preferably of stainless steel, which is sealably connected to the chamber cover 27 by bolts (not shown). The chamber housing 26, chamber cover 27 and top plate 33 form a sealed vessel enclosing an internal volume that is maintained at a vacuum pressure level during operation of the module 10.

The bottom of the gas mixing chamber 30 is closed by a circular showerhead 35 connected to the bottom of the mixing chamber wall 31. The showerhead 35 may be made of aluminum or of a machinable ceramic material and has a highly polished lower surface to retard the absorption of radiant heat from the higher reaction temperature from the area of a wafer being processed within the chamber 25. The showerhead 35 may have a uniform pattern of holes therethrough (not shown), preferably arranged in a matrix or an array in plural concentric circles about the center thereof, which lies on a vertical axis 37 through the reactor 15. Alternatively, the showerhead 35 may be formed of a porous metal or ceramic plate.

A plurality of gas inlet ports (not shown) are provided in the top plate 33 to which the gas lines 16 are connected. A rotary wafer supporting susceptor 40 is provided within the reaction chamber 25. The susceptor 40 lies on the axis 37 directly beneath the showerhead 35 and is in axial alignment therewith. A cleaning gas entry port 41 is mounted to the chamber cover 27 and is connected to the cleaning gas input line 17. The RF upper electrode terminal and cooling water connector 23 is also mounted to the chamber cover 27. The lower electrode RF terminal and cleaning gas connector 24 are mounted to the side wall of the housing 26. A single vacuum outlet port 42 is provided in the bottom of the chamber housing 26 to which the vacuum outlet line 21 is connected to the pump 18, which operates at a pumping rate of from 400–500 liters per second to achieve the wafer processing pressures at between 1 and 100 Torr, reactor cleaning pressures of from 0.1 to 100 m Torr, and wafer transfer pressures of $10^{-4}$ Torr within the chamber 25. A gate port 43 is provided in the forward wall of the housing 26 for connection to a transport module or wafer handling module of a cluster tool, to and from which wafers are loaded and unloaded from chamber 25 for processing. The gate 43 is approximately in horizontal alignment with an upwardly facing wafer supporting top surface 44 of the susceptor 40 whereupon a wafer is supported for processing with its upwardly facing side disposed horizontally parallel to and in vertical alignment with the showerhead 35. A plurality of ports 45 are provided in horizontal alignment with the wafer support surface 44 or the housing 26 on opposite sides of the reaction chamber 25 for inserting diagnostic or other instrumentation.

Fixed to the bottom of the housing 26 and aligned with the reactor axis 37 is a susceptor drive support frame 47. Rotatably mounted within the drive support frame 47 is a hollow and circular in cross-section susceptor drive shaft 50. The drive shaft 50 is mounted to rotate on its axis, which is on the reactor axis 37, extends through a hole 51 in the bottom of the reactor housing 26, and is rigidly connected to the bottom of the susceptor 40. At the hole 51, the shaft 50 is rotatably supported on a main bearing 52 having its inner race surrounding the shaft 50 in tight contact therewith and its outer race fixed to the frame 47 at the bottom of the housing 26. A secondary bearing 53, connected to the lower end of the frame 47, tightly surrounds and supports the lower end of the drive shaft 50. Secured to the support frame 47 immediately below the bearing 52 and tightly surrounding the shaft 50 is a ferrofluidic seal 54. The ferrofluidic seal 54 has fluid circulated through it at a temperature of less than 70° C. to prevent the ferrofluid within it from decomposing and losing its magnetic properties due to heat from the shaft 50. Above the secondary bearing 53 within the frame 47 and also surrounding the shaft 50 is an electrical slip ring connector 55. The slip ring 55 provides electrical connection with the rotating shaft 50 to supply electrical energy to the rotating susceptor and receives sensed temperature signals therefrom. Fixed to the shaft 50 between the seal 54 and the slip ring 55 is a drive pulley 56 which is drivably connected through a drive belt 57 with the output of a susceptor rotation drive motor 58.

Figure 3:
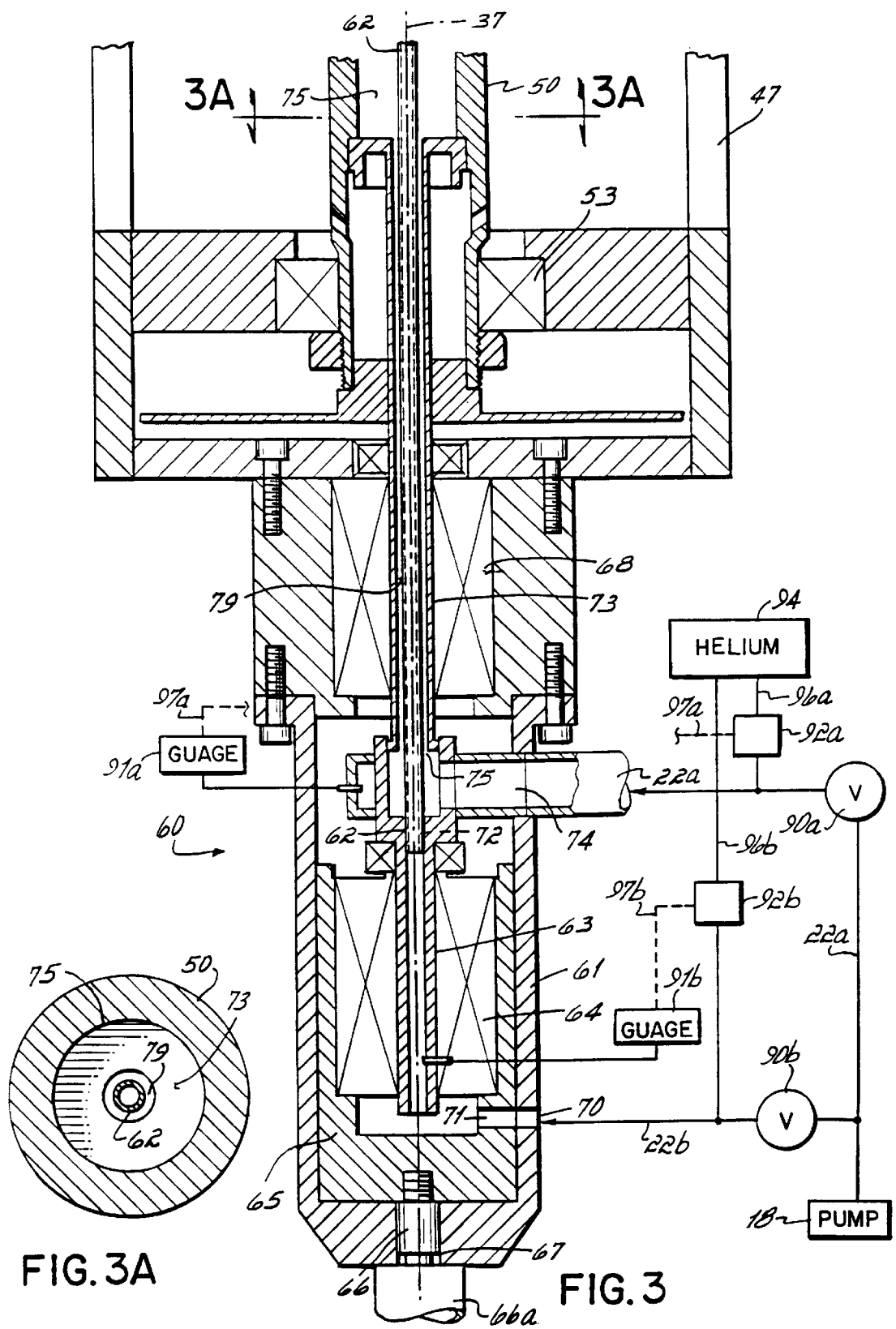
FIG. 3 is a cross-sectional view of the lower part of the reactor of FIG. 2 illustrating the susceptor rotation and wafer lifting sections and various vacuum and gas connections.

At the lower end of the rotating and elevating mechanism 20, fixed to the bottom of the frame 47, is a wafer lift mechanism 60, illustrated in more detail in FIG. 3. The lift mechanism 60 includes an outer fluid-tight shell 61 with a hollow interior enclosing the lower end of a hollow and vertical lift tube 62. The tube 62 extends vertically from the lift mechanism 60 upwardly through the frame 47 and through the hollow interior of the drive shaft 50, along the axis 37 of the reactor, and into the chamber 25, terminating in the interior of the susceptor 40 as may be seen in FIGS. 4 and 5. The tube 62 rotates with the drive shaft 50 and slides axially therein a distance of approximately nine millimeters to raise and lower a wafer on the wafer support surface 44 of the susceptor 40 in the reaction chamber 25. The lower end of the tube 62 is fixed to a hub piece 63 and rotatably supported in a ferrofluidic seal 64, the outer surface of which is fixed in a sleeve 65 which is vertically slidable in the shell 61. The lower end of the sleeve 65 is linked to a vertical actuator 66 extending through a hole 67 in the bottom of the shell 61 of a linear action pneumatic lift 66a. Another ferrofluidic seal 68 is provided near the upper portion of the interior of the shell 61 surrounding the tube 62 on the axis 37 adjacent the bottom of the frame 47 of the rotating and elevating mechanism 20. As with the ferrofluidic seal 54, the seals 64 and 68 are supplied with fluid that is maintained at a temperature of 70° C. or less.

An inlet port 70 at the bottom of the shell 61 of the lift mechanism 60 communicates with inlet channel 71 at the base of the hub piece 63, which communicates through the hollow interior thereof with an axial bore 72 of the tube 62, extending the length thereof, to communicate with the susceptor backplane as discussed below.

A vacuum outlet port 74 is provided in the shell 61 and connects with an elongated hollow tube 73 to apply vacuum in a hollow space 75 within the drive shaft 50 at the upper end thereof surrounding the tube 62, as illustrated in FIG. 3A. The hollow space 75 extends the length of the drive shaft 50 and also communicates with the interior of the susceptor 40 within the reaction chamber 25 as illustrated in FIG. 4.

The vacuum provided in the interior of the susceptor creates a first vacuum environment which surrounds and protects the heating elements of the susceptor as discussed in greater detail hereinbelow. This vacuum pressure is communicated between the vacuum port 74 and the space 75 at the top of the drive shaft 50 through an annular column or space 79 that surrounds the tube 62 and lies within the tube 73.

Vacuum pump 18 is connected to port 74 through line 22a and is connected to port 70 through line 22b to create first and second vacuum environments as will be described. Appropriate valving mechanisms 90a and 90b in lines 22a, 22b, respectively, control the vacuum pressures at ports 74 and 70. Furthermore, gauges 91a, 91b are used to measure the vacuum pressures in lines 22a, 22b. Gauges 91a, 91b are coupled to flow controllers 92a, 92b, respectively, for controlling helium flow from a helium supply 94 which supplies helium to both ports 70, 74 through lines 96b and 96a, respectively. A vacuum exists at ports 70, 74 the same time that helium gas is being introduced into the ports.

Referring now to FIG. 4, susceptor 40 includes a susceptor body 100 which is connected to a generally planer susceptor backplane 102 such as with screws 103. Preferably, around twenty such screws are placed around the periphery of the susceptor backplane 102 to firmly and evenly secure the backplane to body 100 and are recessed into backplane 102. An annular Nickel cap 105 surrounds backplane 102 and covers screws 103 to present a flat backplane surface 104. The susceptor body 100 is preferably formed of a nickel-copper alloy such as Monel 400 available from Pinnacle Manufacturing of Phoenix, Ariz. Susceptor backplane 102 is nickel. The backplane 102 includes a wafer supporting surface 104 which supports a wafer 106 thereon. The bottom portion of body 100 includes a collar portion with a generally horizontally extending annular flange 110. Flange 110 sits on top of a shoulder surface 112 formed at the top of the drive shaft 50 and screws 113 extend through flange 110 and into drive shaft 50 proximate the shoulder surface 112 to secure the susceptor body 100 to shaft 50 so that the susceptor rotates when shaft 50 rotates. A sleeve 114 surrounds shaft 50 proximate susceptor 40 and is mounted to the floor of housing 26.

In the bottom surface of susceptor backplane 102, an annular recess 118 is formed to receive a circular resistive heating element 120. Heating element 120 is held within recess 118 preferably in intimate surface-to-surface contact with the susceptor backplane 102. Heating element 120 is held against backplane 102 by a ceramic backing plate 122 which is secured to the bottom surface of backplane 102 by screws 124 (only one shown). Heating element 120 is electrically connected to an appropriate control line 126 which extends radially inwardly to the center of the susceptor 40 and then downwardly parallel with the center axis 37 to connect with control circuitry (not shown) for controlling the temperature of the heating element 120 and the backplane 102 so that a wafer 106 supported on the backplane may be heated according to process parameters. Line 126 is connected to heating element 120 through two spring loaded connectors 127 (one of which is shown) which sits within a recess in the ceramic backing plate 122. A thermal sensor such as a thermocouple 128 is connected to the heating element 120 through ceramic backing plate 122. Thermocouple 128 is attached to an associated sensor line 130 which extends downwardly through the center of the susceptor 40 parallel axis 37 to appropriate heater control circuitry and provides feedback to the control circuitry such that the temperature of the heating element 120 may be thereby adjusted through line 126 for proper heating of the wafer 106. Lines 126 and 130 make electrical connection through slip ring 55 (See FIG. 2) to the power supplies and control circuits.

A hub 132 made of ceramic macor encircles the center of susceptor 40 inside the susceptor body 100 and includes a radial portion 134 which rests on a bottom surface of susceptor body 100 inside of the susceptor body. The top of hub 132 abuts against the bottom surface of the ceramic backing plate 122 inside of a sleeve 136 depending from the bottom surface of the ceramic backing plate 122. The bottom of hub 132, in turn, abuts against a plastic sleeve 138 which extends inside drive shaft 50 concentrically therewith and surrounding lift tube 62. Sleeve 138 aligns heater and thermocouple lines 126, 130 with the center axis 37 of the susceptor.

The susceptor body 100 forms a heater housing volume 140 therein which generally surrounds the heating components of susceptor 40 including heating element 120 and electrical connector 127 and line 126, as well as thermocouple 128 and line 130. Volume 140 is in communication with space 75 formed by drive shaft 50 and thus is vacuumed when space 75 is vacuumed such as by vacuum outline line 22a and pump assembly 18. In accordance with the principles of the present invention, heater housing volume 140 within susceptor body 100 is sealed to be fluid and air tight to protect the heating components, and particularly the heating element 120, from the corrosive chemical vapors within chamber 25.

More specifically, susceptor body 100 is sealed to the backplane 102 and shaft 50 with sealing structures. A top annular seal 142 is positioned within an annular channel 143 formed at the interface between the susceptor body 100 and the backplane 102 generally around the periphery of backplane 102 as illustrated in FIG. 4A in greater detail. Seal 142 is preferably a silver compression seal made of 100% silver having a generally rectangular transverse cross-section. The width W of seal 142 is preferably 3/16 inch in the embodiment shown in the Figures, while the thickness T is preferably 1/16 inch for that embodiment. The diameter of seal 142 will be dependent upon the size of the susceptor 40 and the placement of the channel 143 in susceptor body 100 and backplane 102. A suitable seal 142 for the embodiment in the Figures is manufactured by Pinnacle Manufacturing in Phoenix, Ariz. As may be appreciated, the dimensions of the annular seal 142 may be varied depending upon the construction of the susceptor.

The interface of backplane 102 at channel 143 includes a sharply angled annular ridge 146 which extends vertically downward and presses into the soft metallic seal 142 when backplane 102 is secured to the susceptor body 100 (See FIG. 4A). The susceptor body 100 includes a similar angled ridge 148, opposite ridge 146, which extends vertically upward into seal 142. The ridges 146, 148 and seal 142 insure that a gas-tight seal is made at the interface between the susceptor backplane 102 and body 100 to isolate volume 140 from the reaction chamber 25 and prevent entry of corrosive reactant gases into volume 140 through the interface.

The heater housing volume 140 is further sealed by a bottom annular seal 150 around the interface between the susceptor body 100 and shaft 50. One useful seal for both annular seal 150 is a composite metal seal formed in accordance with U.S. patent application Ser. No. 08/241,192 filed May 11, 1994 entitled THERMAL CYCLE RESISTANT SEAL FOR USE IN SEMI-CONDUCTOR WAFER PROCESSING APPARATUS owned by Materials Research Corporation and which is incorporated entirely herein by reference. Referring now to FIG. 6, an appropriate sealing element or seal 150 is shown enlarged. Seal 150 is circular in the form of a ring and includes a rigid metallic core 152 and a ductile metallic coating 154 on the core 152. Preferably the rigid metallic core 152 is stainless steel, and the ductile metallic coating 154 is silver. As is seen in FIG. 6, the cross-section of the seal 150 is generally diamond-shaped. This diamond-shaped seal cross-section has upper and lower blunt tips 156 and 158, respectively. The clamping force generated by screws 113, preferably stainless steel screws, of the flange 110, or upper gland, and the shaft 50, or lower gland, on the seal 150 preferably develops a contact stress in the ductile coating 154 sufficient to plasticly deform the ductile coating 154 to accommodate surface imperfections on the susceptor and shaft sealing surfaces 160 and 162, respectively, but insufficient to cause ultimate failure of the ductile coating 154.

In the preferred form of the seal 150 of the present invention, the core 152 has the following dimensions prior to being coated by coating 152: The seal core cross-section has a dimension parallel the seal longitudinal axis of symmetry of about 0.105 inch to about 0.107 inch. Further, the seal core has an inner diameter of about 2.645 in., and an outer diameter of about 2.865 in., and therefore the seal core cross-section has a dimension transverse the seal longitudinal axis of symmetry of about 0.110 in. Measuring from the radially innermost edge of the blunt tips, the seal core cross-section has a diameter of about 2.743 in., and measuring from the radially outermost edge of the blunt tips the seal core cross-section has a diameter of about 2.767 in. Thus, the upper and lower blunt tips 156, 158 of the seal core cross-section have a dimension transverse the seal longitudinal axis of about 0.012 in. The seal core cross-section includes four angled seal cross-section faces 164, 166, 168 and 170 each of which forms an angle of about 50° with respect to the seal longitudinal axis of symmetry. The metallic ductile coating 154 applied to core 152 preferably has a thickness of about 0.003 to about 0.005 in.

The stainless steel utilized in core 152 is preferably 17-4 stainless steel heat treated to condition H-1100. The above-mentioned dimensional limits apply prior to silver plating of the seal 150. The silver plating is to be applied per QQ-S-365 (fully annealed) to a thickness of, as specified above, about 0.003 inch to about 0.005 inch and uniform within 0.001 in. After plating, the seal 150 is to be baked to 375° F. for three hours to remove hydrogen embrittlement from the plating. After plating, the dimension of the seal cross-section parallel the seal longitudinal axis of symmetry should be within about 0.111 inch to about 0.117 inch.

The seal 150 thus fabricated maintains a leak tight seal after repeated thermal cycling. The seal 150 has successfully operated at 510° C. through two thermal cycles with no signs of leakage. The seal 150 therefore is constructed of a rigid metallic core material with a ductile coating that will plasticly deform to accommodate the surface imperfections that exist on the sealing faces of the gland, such as the surfaces 160, 162 of the susceptor body 100 and shaft 50. The dimensions of the core material and ductile coating must be large enough to ensure that the total seal thickness, controls the separation distance between the sealing faces of the gland. Furthermore the seal clamping elements (typically screws or bolts) must provide sufficient elasticity at the operating temperatures to accommodate any thermally induced dimensional changes and maintain sufficient contact pressure at the sealing faces of the gland at all times.

The material of the clamping elements, glands and seal core are selected to provide the correct combinations of coefficient of thermal expansion to minimize the change in the gland seal face separation distance throughout the operating temperature range. The susceptor drive shaft 50 is preferably fabricated of 17-4 PH stainless steel, and the susceptor body 100 is preferably fabricated of Monel 400, a copper and nickel based alloy as already discussed. The clamping element material and design are selected to allow the elements to maintain clamping of the gland seal faces throughout the operating temperature range. Seal 150 is discussed in greater detail in U.S. patent application Ser. No. 08/241,192 referenced above.

Another appropriate seal structure for sealing the interface between susceptor body 100 and shaft 50 is the Helicoflex seal type HNV 230/Part No. H-303183 from Helicoflex Components Division of Columbia, S.C. Referring to FIG. 7, the seal 200 includes a spiral alloy spring 202 which is coiled with the coils welded together to form a generally unitary structure. An intermediate layer 204 of Inconel 600 surrounds spring 202. Intermediate layer 204 has opposing angled ends 205, 206 and does not extend entirely around the spring 202. On the outside of seal 200, a layer of nickel 208 surrounds spring 202 and intermediate layer 204. Nickel layer 208 has tapered ends 209, 210 and the nickel layer 208 is wound around spring 202 and intermediate layer 204 such that ends 209, 210 overlap at 211. At the top and bottom surfaces of the seal are ridges 212, 214 which are preferably formed with a point. The ridges embed into the respective surfaces of the interface between body 100 and shaft 50. Ridge 214 is shown embedded into surface 216. Seal 200 operates preferably around 450° C. maximum and is compressed with a seating load of approximately 1150 pounds/ inch. The interface surfaces are preferably machined to a groove finish of less than or equal to approximately 32 micro inches rms, while the hardness at the interface should preferably be greater than or equal to approximately 150 HV on the Vickers Hardness Scale.

The Helicoflex seal 200 has a generally circular cross-section having a preferable cross-sectional dimension of 0.109 inches. The nickel of seal 200 allows it to withstand repeated thermal cycling, which is able to withstand repeated thermal cycling. The ring diameter of the annular seal 150 or 200 for the embodiment shown in the Figures is approximately 2.75 inches; however, the ring diameter and cross-sectional dimensions of the seal will generally be dependent upon the susceptor dimensions.

Seals 142 and 150/200 provide a heater housing volume 140 around the heating element 120 which is generally gas-tight to protect the heating element. Volume 140 communicates with vacuum space 75 and is thus evacuated to the pressure maintained with the drive shaft 50 and space 75. Preferably, volume 140 is maintained at a pressure which is the same as or slightly higher than the pressure maintained within reaction chamber 25. In that way, any leakage between volume 140 and chamber 25 will be out of the susceptor 40 and volume 140 rather than into volume 140. This insures that the corrosive reactant chemical gases and vapors which are utilized in the CVD processes within chamber 25 do not enter volume 140 and corrode or otherwise damage heating element 120. The susceptor body 100 and seals 142, 150/200 form a first vacuum environment within volume 140 which is maintained at a pressure in the range of 1 Torr to 100 Torr depending on the process pressure within the chamber 25. The preferred internal pressure of volume 140 is approximately 25 Torr. The seals 142 and 150/200 are high temperature metal seals which are able to withstand the elevated temperatures utilized in CVD processing and are thus functional after several or more thermal cycles.

When volume 140 is vacuumed, helium is also introduced into the first vacuum environment. Referring again to FIG. 3, a supply of helium 94 is coupled to vacuum line 22a by line 96a. An appropriate valve device 90a determines the internal vacuum pressure in line 22a and the pressure at port 74, which, in turn, sets the pressure in space 75, and ultimately, in volume 140 (see FIG. 4). Gauge 91a measures the internal pressure of volume 140. In one embodiment of the invention, Gauge 91a is preferably a capacitance manometer, and a suitable manometer for the present invention is the MKS model #122A-00100DB available from MKS Instruments in Andover, Mass.

After a suitable pressure has been produced in volume 140, a helium flow control device 92a, such as MKS model 1159B-00100RV-S mass flow controller available from MKS Instruments of Andover, Mass., introduces helium into space 75 and volume 140. A control line 97a couples gauge 96a to mass flow controller 92a to control the introduction of helium. The helium surrounds and protects the heating element 120 in susceptor 40. In accordance with the principles of the present invention, the volume 140 is initially evacuated to around 0.1 milliTorr and then the helium is introduced raising the pressure to between 1 and 100 Torr and preferably around 25 Torr. Control line 97a communicates the initial internal pressure of space 75 to flow controller 92a to control the flow of helium to achieve the desired end pressure.

As discussed hereinabove, for a more efficient heat transfer, a backside gas is provided to the back of wafer 106 which rests on surface 104 of the susceptor backplane 102. Generally, thermal response and heating of the wafer 106 is improved when a gaseous heat transfer medium is provided between the heated susceptor backplane 102 and the backside of wafer 106. However, as discussed above, in order to provide a passageway for backside heating gas, a penetration or opening must be made through the susceptor and particularly through the susceptor backplane 102. Generally, such a penetration would provide an opening into volume 140 which houses heating element 120. When a wafer is not present over the opening in susceptor backplane 102, there is a direct path from the reaction chamber 25 to volume 140 and the heating element 120, thereby allowing corrosive vapors to reach heating element 120.

In accordance with the principles of the present invention, a second or inner vacuum environment is created within susceptor 40 such that backside heating gas may be presented to the wafer 106 without exposing volume 140 and heating element 120 to corrosive chemical vapors. The inner vacuum environment is created around hollow lift tube 62 and is isolated from the first vacuum environment in volume 140. Referring to FIGS. 4 and 5, lift tube 62 is hollow along almost its entire length and extends vertically through the center of susceptor 40 within drive shaft 50. Lift tube 62 is preferably stainless steel and the top end thereof includes a solid stainless steel tip 176. Tip 176 connects to a wafer lifting assembly 178 which preferably includes approximately three radial legs 180 with lift pins 182 at the ends thereof which rest against the backside of wafer 106. (See FIG. 4). Lift tube 62 moves vertically within drive shaft 50 and through an aperture or opening 184 formed within backplane 102. As mentioned above, lift tube 62 is moved upwardly and downwardly appropriately 9 mm to raise and lower wafer 106. The tip 176 includes a reduced-diameter portion which moves within a stop structure 185 positioned coaxially with opening 184. Stop structure 185 includes a cooperating reduced-diameter section which limits the upward movement of tip 176 and tube 62 as may be seen in FIG. 5.

To facilitate a second vacuum environment, lift tube 62 is surrounded by an elongated stainless steel sheath 186 which extends along and covers a portion of tube 62. The top end of sheath 186 includes a flange 188 which, in one embodiment of the invention, is fixed to backplane 102 with screws 189. Like tube 62 and coaxial therewith, the sheath 186 extends through the center of the susceptor 40 and heating element 120 and abuts against backplane 102 proximate opening 184. As best seen in FIG. 5, sheath 186 defines a vacuum space 190 between the sheath 186 and outer wall 191 of lift tube 62. A series of apertures 192 are formed in the lift tube 62. The apertures 192 are within the portion of tube 62 covered by the sheath 186 and are preferably arranged radially around tube 62. The apertures 192 and tube 62 provide a connection to the bore or space inside hollow tube 62 which is evacuated by pump 18 via lines 22b and port 70. This in turn, evacuates vacuum space 190. Apertures 192 also provide openings for introducing a backside heating gas, such as helium, into space 190 for delivery to the wafer 106 through opening 184. Backside heating gas introduced by supply 94 and line 96b moves through space 190 and through opening 184 to contact the backside of wafer 106 for efficient thermal conduction between backplane 102 and the wafer. The backside heating gas is distributed around wafer 106 by radial channels 193 and an annular channel 195 connecting the ends of channels 193 which are formed in the top surface 104 of backplane 102. Radial channels 193 receive the legs 180 of the wafer lifting assembly.

In accordance with the principles of the present invention, space 190 forms a second vacuum environment within the susceptor to isolate heating element 120 from corrosive chemical vapors. Referring to FIG. 5, in one embodiment of the invention, at the top end of sheath 186 an annular upper seal 194 is placed at the interface between backplane 102 and a sheath flange 188. Upper seal 194 is preferably a nickel compression seal made of 100% nickel and available from State Seal in Phoenix, Ariz. The seal 194 extends around the sheath flange backplane interface within a channel 197 formed in sheath flange 188. Seal 194 forms a gas-tight interface proximate opening 184 such that corrosive chemical vapors of reaction chamber 25 cannot enter volume 140 at the interface. The seal 194 is compressed at the interface between backplane 102 and flange. Seal 194 furthermore isolates the volume 140 from vacuum space 190 to maintain the integrity of the first and second vacuum environments.

In an alternative embodiment of the invention, as shown in FIG. 5A, the flange 188 of sheath 186 is welded to backplane 102 proximate opening 184 to seal volume 140 from volume 190 and the environment of chamber 25. The welding eliminates the necessity of both screws 189 and seal 194 as illustrated in FIG. 5A.

As illustrated and discussed, the sheath 186 defining the second vacuum environment surrounds the lift tube 62 which is also surrounded by the space 75 of shaft 50 which makes up a portion of the first vacuum environment. (See FIG. 5). To maintain the integrity of the second vacuum environment and to isolate it from the first environment along lift tube 62, the sheath 186 is sealed to the tube. Specifically, at the bottom end of sheath 186 there is a cylindrical flange portion 196 which has an annular channel 198 formed therein. Channel 198 faces and abuts against the outer wall 191 of tube 62. A lower annular seal 199 is placed within channel 198 to seal vacuum environment space 190 from space 75 which communicates with volume 140 forming the heater housing environment or first vacuum environment. The seal 199 is preferably a dynamic seal which allows movement of the lift tube 62 therethrough without comprising the seal formed at the interface between the wall 191 of lift tube 62 and the cylindrical flange portion 196 of sheath 186. That is, lift tube 62 slides up and down with respect to seal 199 and outer wall 191 moves adjacent seal 199 without deleterious effects on the integrity of the second vacuum environment. A suitable seal for such a purpose is the VITON™ seal available from State Seal of Phoenix, Ariz. The VITON™ seal 199 is circular in cross-section and preferably has a cross-sectional dimension of 0.070 inches. The diameter of the annular seal is preferably 0.239 inches, although the dimensions of the seal may vary as discussed above.

The vacuum space 190 is formed between flange 188 and seal 194 at the upper end of sheath 186 and flange portion 196 and seal 199 at the lower end of sheath 186. Apertures 192 for the evacuation of space 190 and the introduction of a backside heating gas are locked in tube 62 between seals 194, 200. Space 190 is preferably maintained at a vacuum pressure of approximately 1 Torr to 100 Torr, depending on the process pressure within chamber 25. The preferred pressure is 10 Torr. During CVD processing, the pressure in the inner space 190 is generally maintained less than the process pressure within the reaction chamber 25 when a wafer 106 is present on surface 104 of the susceptor backplane 102. The lower pressure within space 190 maintains a vacuum holddown of the wafer 106 when the wafer covers the opening 184 and channels 193, 195 within the susceptor backplane 102.

When the wafer is vacuum held, the lift tube 62 is at its lowest vertical position, and the lift-assembly 178 is positioned within channels 193, 195 formed within backplane 102. When the processing has been completed, the lift tube 62 is raised which raises tip 184 and the lift-pin assembly 178 such that lift pins 182 press against the backside of wafer 106 and break the vacuum seal so that the wafer can be removed from the process chamber (See FIGS. 4 and 5).

The second vacuum environment inside tube 62 and space 190 is created and maintained very similarly to the way in which the first vacuum environment is created and maintained. Referring again to FIG. 3, the vacuum line 22*b* connects with port 70 and is controlled by the valving mechanism 90*b*. The pressure gauge 91*b*, such as a capacitance manometer similar to gauge 91*a*, measures the pressure a port 70 and within the second vacuum environment. The inner bore of lift tube 62 and space 190 (see FIG. 5) is evacuated to around 0.1 milliTorr. A control line 97*b* connects gauge 90*b* to a mass flow controller 92*b* similar to mass flow controller 92*a* already described. When the desired pressure in tube 62 is achieved as measured by gauge 90*b*, the mass flow controller is operated, via line 22*b*, to inject helium into port 70 which raises the pressure to a pressure of from 1 to 100 Torr, and preferably around 10 Torr. The helium travels through lift tube 62, into space 190 and against the backside of wafer 106 for efficient heat transfer to the wafer. When a wafer 106 is not present on surface 104, the space 190 is in direct communication with the reaction chamber 25. However, because space 190 is isolated from the first vacuum environment in volume 140 surrounding the heating element 120, there is no damage to the heating element by the corrosive chemical vapors in the reaction chamber 25.

Therefore, the present invention provides complete isolation of any heating elements and other devices within susceptor 40 and volume 140 to prevent corrosion of those elements. The first and second vacuum environments 140, 190 along with the four seals associated therewith effectively provide isolation of the heating element environment from the reaction chamber environment. Simultaneously, the backside heating gas is introduced through a second vacuum environment to provide efficient thermal transfer of heat from backplane 102 to wafer 106. Seals 142, 150, 194 and 200 are able to withstand the high temperatures associated with CVD processing.

While the present invention has been illustrated by the description of the embodiments thereof, and while the embodiments have been described in considerable detail, it is not the intention of applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departure from the spirit or scope of applicant's general inventive concept.

What is claimed is:

1. A method for efficiently heating, with a heating element, a wafer within a CVD reaction space evacuated to a process pressure while effectively isolating the heating element from the CVD environment comprising:

placing a wafer on a surface of a susceptor, the susceptor having a space therein for housing a heating element coupled to the surface to heat the surface and the wafer;

sealing the susceptor space with respect to the CVD reaction space to effectively isolate the heating element from the CVD environment;

directing backside heating gas into a space extending through the susceptor space and through an opening in the susceptor surface such that the gas contacts a wafer on said surface and facilitates efficient heat transfer between the wafer and the heated surface; and sealing the gas directing space with respect to the susceptor space to prevent exposure of the heating element to the gas directing space and to further effectively isolate the heating element from the CVD environment;

whereby the wafer is efficiently heated while the heating element is protected from corrosive chemical vapors existing in the CVD environment.

2. The method of claim 1 further comprising the step of placing a wafer over the surface opening to cover the opening and seal the gas directing space from both the susceptor space and the CVD reaction space.

3. The method of claim 2 further comprising the step of evacuating the gas directing space to a pressure lower than the process pressure to create a vacuum hold of the wafer over the surface opening.

4. The method of claim 3 further comprising the step of maintaining the susceptor space at pressure greater than the process pressure such that leaks in the sealed susceptor are effectively directed out of the susceptor space rather than into it.

5. The method of claim 1 wherein the susceptor includes a susceptor body and a planar member having the surface thereon and further includes a gas delivery tube extending through said susceptor body and susceptor space to deliver backside heating gas to the wafer, the method further comprising:

surrounding the gas delivery tube with an elongated sheath, the gas directing space being formed between the sheath and the tube;

sealing an interface between one end of the sheath and the tube; and sealing an interface between the other end of the sheath and the planar member whereby to seal the gas directing space from the susceptor body and effectively isolate the heating element from the CVD environment.

6. The method of claim 5, the sealing steps including positioning an annular seal structure around the tube end at an interface between the sheath and one of the tube and the planar member.

7. The method of claim 6 further comprising compressing a nickel seal at the interface between the sheath and the planar member.

8. The method of claim 6 further comprising the step of positioning a dynamic seal structure at the interface between the tube and sheath to allow movement of the tube within the sheath.

9. The method of claim 6 wherein the gas delivery tube is movable with respect to the susceptor body, and is coupled to a wafer lifting mechanism, the method further comprising lifting the tube to lift the wafer away from the surface.

10. The method of claim 1 wherein the susceptor includes a susceptor body, a support fixed to the bottom of the body, and a planar member fixed to the top of the body and having said surface, the susceptor space defined by said body, support and planar member and the step of sealing the susceptor space comprising:

sealing an interface between the susceptor body and support; and sealing an interface between the susceptor body and the planar member.

11. The method of claim 10 wherein the step of sealing the interface between the susceptor body and planar member includes compressing a silver seal at the interface.

12. The method of claim 10 wherein the step of sealing the interface between the susceptor body and support includes compressing a metal seal having a rigid metal core and a ductile coating at the interface.

13. A method of depositing a layer of material on a semiconductor wafer by chemical vapor deposition (CVD) including the step of heating the wafer, the method comprising:

placing a wafer on a surface of a susceptor, the susceptor having a space therein for housing a heating element coupled to the surface to heat the surface and the wafer;

sealing the susceptor space with respect to the CVD reaction space to effectively isolate the heating element from the CVD environment;

directing backside heating gas into a space extending through the susceptor space and through an opening in the susceptor surface such that the gas contacts a wafer on said surface and facilitates efficient heat transfer between the wafer and the heated surface; and sealing the gas directing space with respect to the susceptor space to prevent exposure of the heating element to the CVD reaction space and to further effectively isolate the heating element from the CVD environment;

introducing CVD reactant gases in the proximity of the wafer to react and deposit a material layer on the heated wafer;

whereby a material layer is deposited on a heated wafer while the heating element is protected from corrosive effects of the CVD reactant gases contributing to the material layer.

14. The method of claim 13 further comprising the step of placing a wafer over the surface opening to cover the opening and seal the gas directing space from both the susceptor space and the CVD reaction space.

15. The method of claim 14 further comprising the step of evacuating the gas directing space to a pressure lower than the process pressure to create a vacuum hold of the wafer over the surface opening.

16. The method of claim 13 further comprising the step of maintaining the susceptor space at a pressure greater than the process pressure such that leaks in the sealed susceptor are effectively directed out of the susceptor space rather than into it.

17. The method of claim 13 wherein the susceptor includes a susceptor body and a planar member having the surface thereon and further includes a gas delivery tube extending through said susceptor body and susceptor space to deliver backside heating gas to the wafer, the method further comprising:

surrounding the gas delivery tube with an elongated sheath, the gas directing space being formed between the sheath and the tube;

sealing an interface between one end of the sheath and the tube; and sealing an interface between the other end of the sheath and the planar member whereby to seal the gas directing space from the susceptor body and effectively isolate the heating element from the CVD environment.

* * * * *

UNITED STATES PATENT AND TRADEMARK OFFICE
CERTIFICATE OF CORRECTION

PATENT NO. : 5,897,380

DATED : April 27, 1999

INVENTOR(S) : Carl White et al.

It is certified that error appears in the above-identified patent and that said Letters Patent is hereby corrected as shown below:

Column 4, line 34 reads "the second or second or backside" and should read --the second or backside--.

Column 6, line 45 reads "made of a thermally conductive material" and should read --made of a thermally nonconductive material--.

Column 12, lines 7 and 8 read "repeated thermal cycling. which is able to withstand repeated thermal cycling. The ring diameter" and should read --repeated thermal cycling. The ring diameter--.

UNITED STATES PATENT AND TRADEMARK OFFICE
CERTIFICATE OF CORRECTION

PATENT NO.  : 5,897,380
DATED       : April 27, 1999
INVENTOR(S) : Carl White et al.

It is certified that error appears in the above-identified patent and that said Letters Patent is hereby corrected as shown below:

Column 14, line 38 reads "comprising the seal formed" and should read --compromising the seal formed--.

Column 14, line 54 reads "gas are locked in" and should read --gas are located in--.

Column 15, line 14 reads "a port 70" and should read --of port 70--.

Signed and Sealed this

Eleventh Day of April, 2000

Attest:

Attesting Officer

Q. TODD DICKINSON

Director of Patents and Trademarks